US011158633B1

(12) United States Patent
Wang et al.

(10) Patent No.: US 11,158,633 B1
(45) Date of Patent: Oct. 26, 2021

(54) MULTI-LEVEL ISOLATION STRUCTURE

(71) Applicant: GLOBALFOUNDRIES U.S. Inc., Santa Clara, CA (US)

(72) Inventors: Haiting Wang, Clifton Park, NY (US); Sipeng Gu, Clifton Park, NY (US); Shesh Mani Pandey, Saratoga Springs, NY (US); Lixia Lei, Clifton Park, NY (US); Gregory Costrini, Flanders, NJ (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/842,075

(22) Filed: Apr. 7, 2020

(51) Int. Cl.
| H01L 27/088 | (2006.01) |
| H01L 29/06 | (2006.01) |
| H01L 21/8234 | (2006.01) |
| H01L 27/092 | (2006.01) |
| H01L 29/78 | (2006.01) |

(52) U.S. Cl.
CPC .. H01L 27/0886 (2013.01); H01L 21/823431 (2013.01); H01L 21/823481 (2013.01); H01L 27/0924 (2013.01); H01L 29/0649 (2013.01); H01L 29/785 (2013.01)

(58) Field of Classification Search
CPC ............. H01L 27/0886; H01L 27/0924; H01L 29/0649; H01L 29/785; H01L 21/823431; H01L 21/823481
USPC .......... 257/369, 401, 190, 288, 506, E27.06, 257/E27.062, E27.112, E29.255, E29.262, 257/E29.267, E21.421, E21.19, E21.409, 257/E21.546; 438/283, 285, 187, 197, 438/424, 478
See application file for complete search history.

(56) References Cited

U.S. PATENT DOCUMENTS

| 5,539,229 | A |  | 7/1996 | Noble, Jr. et al. |
| 7,473,594 | B2 |  | 1/2009 | Chakravarti et al. |
| 7,737,502 | B2 |  | 6/2010 | Beintner et al. |
| 2015/0060960 | A1 | * | 3/2015 | Xie ................... H01L 29/41791 257/288 |
| 2016/0005735 | A1 | * | 1/2016 | Costrini ........... H01L 21/76224 257/401 |
| 2017/0140980 | A1 | * | 5/2017 | Chiang ............... H01L 21/2636 |
| 2019/0097054 | A1 | * | 3/2019 | Kim ................ H01L 21/823431 |

* cited by examiner

*Primary Examiner* — Dao H Nguyen
(74) *Attorney, Agent, or Firm* — Francois Pagette; Hoffman Warnick LLC

(57) ABSTRACT

One illustrative device disclosed herein includes at least one fin structure and an isolation structure comprising a stepped upper surface comprising a first region and a second region. The first region has a first upper surface and the second region has a second upper surface, wherein the first upper surface is positioned at a first level and the second upper surface is positioned at a second level and wherein the first level is below the second level. In this illustrative example, the device also includes a gate structure comprising a first portion and a second portion, wherein the first portion of the gate structure is positioned above the first upper surface of the isolation structure and above the at least one fin structure and wherein the second portion of the gate structure is positioned above the second upper surface of the isolation structure.

18 Claims, 21 Drawing Sheets

MULTI-LEVEL ISOLATION STRUCTURE

BACKGROUND

Field of the Invention

The present disclosure generally relates to various novel embodiments of a multi-level isolation structure for integrated circuit products and various novel methods of making such multi-level isolation structures.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices.

The various transistor devices that are formed for an IC product must be electrically isolated from one another to properly function in an electrical circuit. Typically, in the case of FinFET devices, forming such an isolation structure involves depositing an insulating material, such as silicon dioxide, such that it overfills the spaces between the fins. Thereafter, a CMP process is typically performed to planarize the upper surface of the insulating material. At that point, a recess etching process is performed to remove a portion of the vertical thickness of the insulating material. This recess etching process exposes the desired final fin height of the fins for the devices. This recess etching process also results in an isolation structure that has a substantially planar upper surface.

The present disclosure is generally directed to various novel embodiments of a multi-level isolation structure for integrated circuit products and various novel methods of making such multi-level isolation structures.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a multi-level isolation structure for integrated circuit products and various novel methods of making such multi-level isolation structures. One illustrative device disclosed herein includes at least one fin structure and an isolation structure comprising a stepped upper surface comprising a first region and a second region. The first region has a first upper surface and the second region has a second upper surface, wherein the first upper surface of the isolation structure is positioned at a first level and the second upper surface of the isolation structure is positioned at a second level and wherein the first level is below the second level. In this illustrative example, the device also includes a gate structure comprising a first portion and a second portion, wherein the first portion of the gate structure is positioned above the first upper surface of the isolation structure and above the at least one fin structure and wherein the second portion of the gate structure is positioned above the second upper surface of the isolation structure.

BRIEF DESCRIPTION OF THE DRAWINGS

The disclosure may be understood by reference to the following description taken in conjunction with the accompanying drawings, in which like reference numerals identify like elements, and in which.

Figure 1:
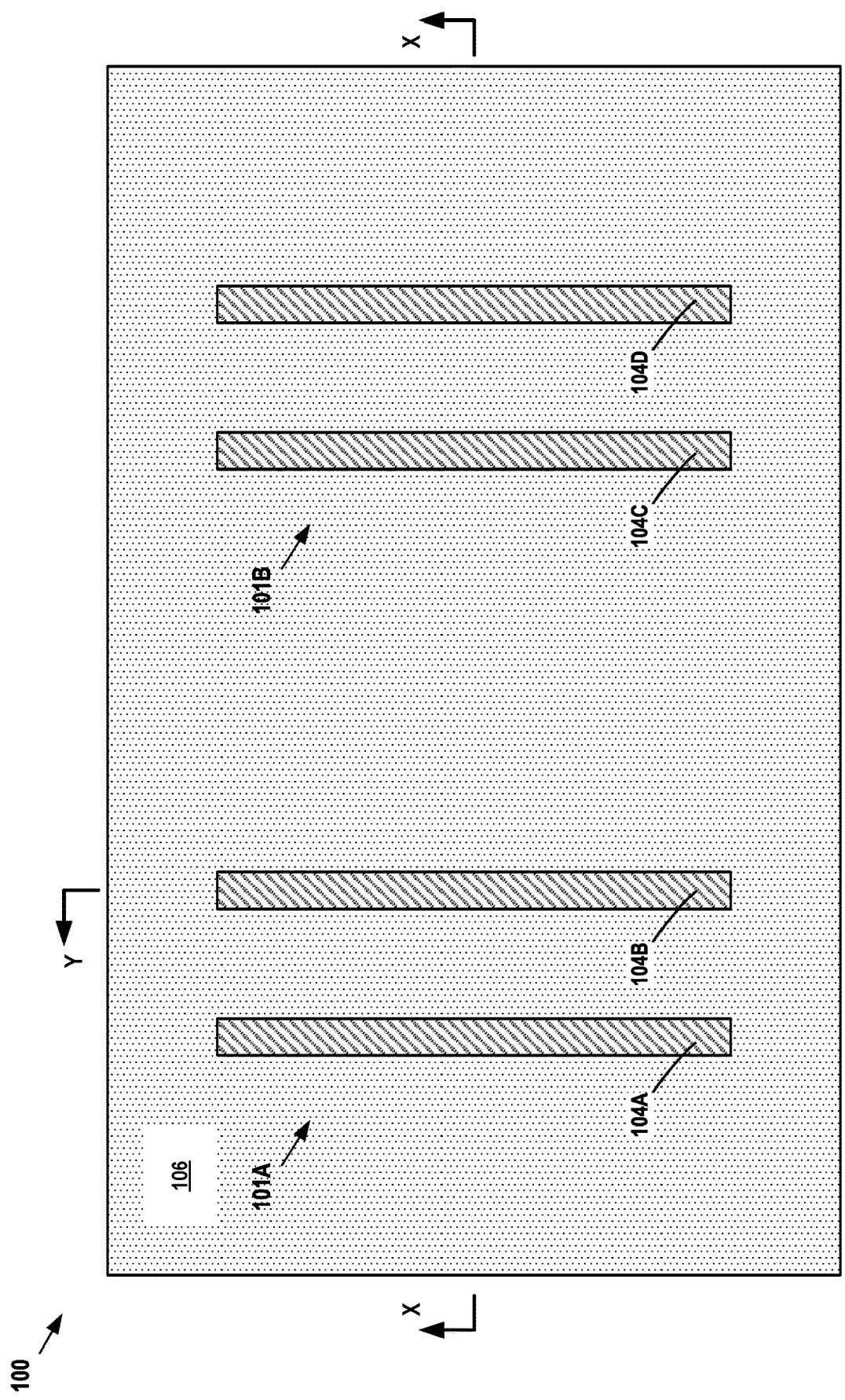
FIGS. 1-21 depict various novel embodiments of a multi-level isolation structure for integrated circuit products and various novel methods of making such multi-level isolation structures. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc., and the transistor devices disclosed herein may be NFET or PFET devices. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application. With reference to the attached figures, various illustrative embodiments of the methods and devices disclosed herein will now be described in more detail.

FIGS. 1-21 depict various novel embodiments of a multi-level isolation structure for integrated circuit products and various novel methods of making such multi-level isolation structures. FIG. 1 is a simplistic plan view of the IC product 100 at a relatively early stage of fabrication. In the example depicted herein, when completed, the IC product 100 will comprise a first transistor device 101A and a second transistor device 101B (collectively referenced using the numeral 101). In one illustrative example, the first transistor device 101A may be an N-type FinFET device while the second transistor device 101B may be a P-type FinFET device, or vice-versa. As will be appreciated by those skilled in the art after a complete reading of the present application, both of the devices 101 could also be the same type, both of the devices 101 could be P-type devices. Moreover, the methods and multi-level isolation structures disclosed herein can be employed to improve the performance of a single transistor device.

Figure 2:
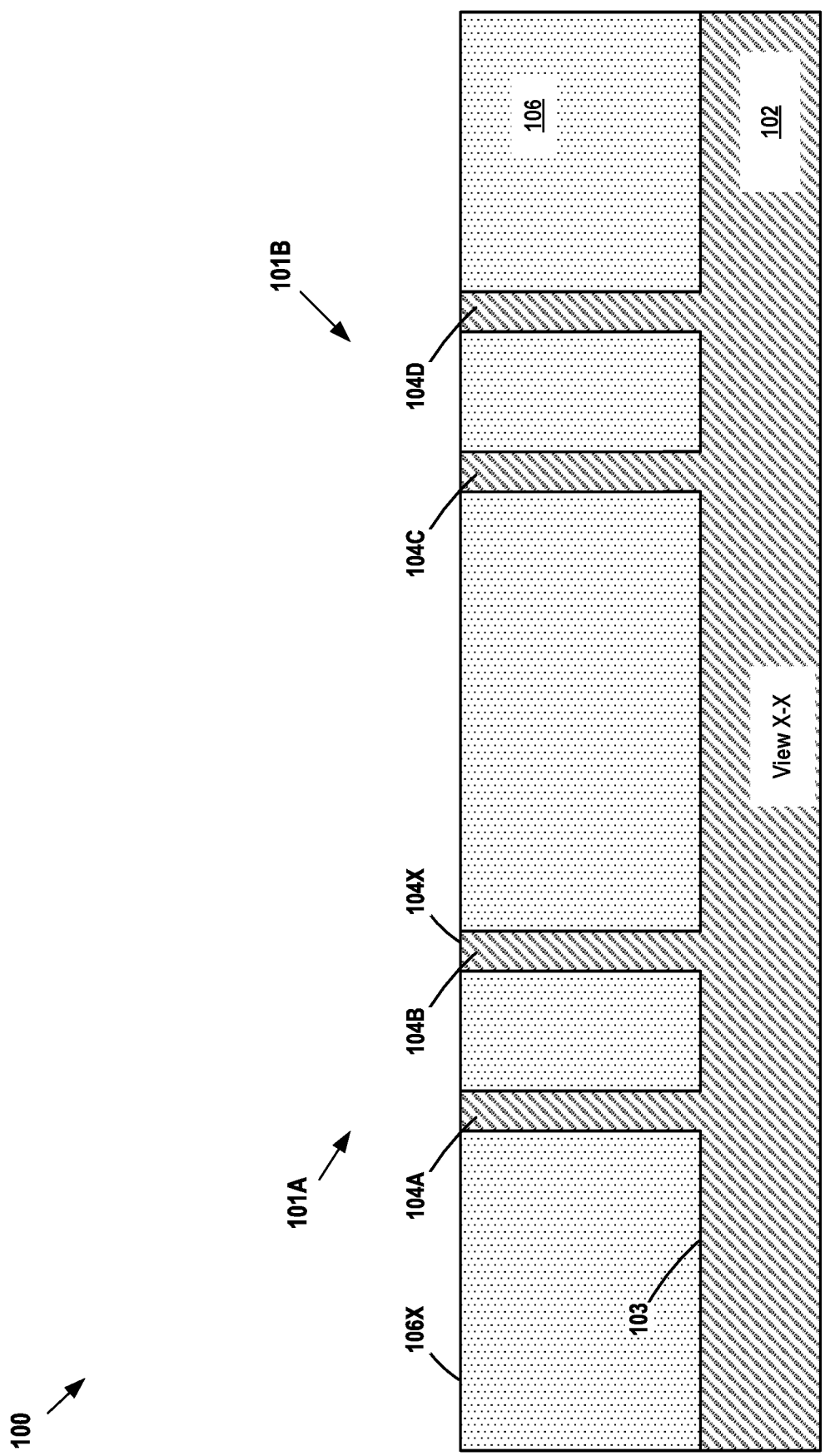

FIG. 1 also depicts a plurality of fins 104A-D (collectively referenced using the numeral 104) that were formed in a semiconductor substrate 102 (see FIG. 2). The first transistor device 101A comprises the fins 104A-B, while the second transistor device 101B comprises the fins 104C-D. Of course, in practice, the devices 101 may comprise one or more fins 104, and the first transistor device 101A and the second transistor device 101B need not have the same number of fins 104, but that may be the case in some applications.

Various cross-sectional views ("X-X" and "Y-Y") of the IC product 100 that are depicted in some of the attached drawings are taken where indicated in FIG. 1. The cross-sectional view X-X is taken in the gate width direction of the devices 101, while the view Y-Y is a cross-sectional view taken along the long axis (i.e., the axial length) of the fin 104B.

With reference to FIG. 2, in the examples depicted herein, the IC product 100 will be formed above a semiconductor substrate 102. The substrate 102 may have a variety of configurations, such as a simple bulk configuration, as depicted herein or a semiconductor-on-insulator (SOI) configuration that includes a base semiconductor layer, a buried insulation layer positioned on the base semiconductor layer and an active semiconductor layer positioned above the buried insulation layer, wherein the transistor devices 101 are formed in and above the active semiconductor layer. The substrate 102 may be made of silicon or it may be made of semiconductor materials other than silicon. Thus, the terms "substrate" or "semiconductor substrate" should be understood to cover all semiconductor materials and all forms of such materials.

Figure 3:
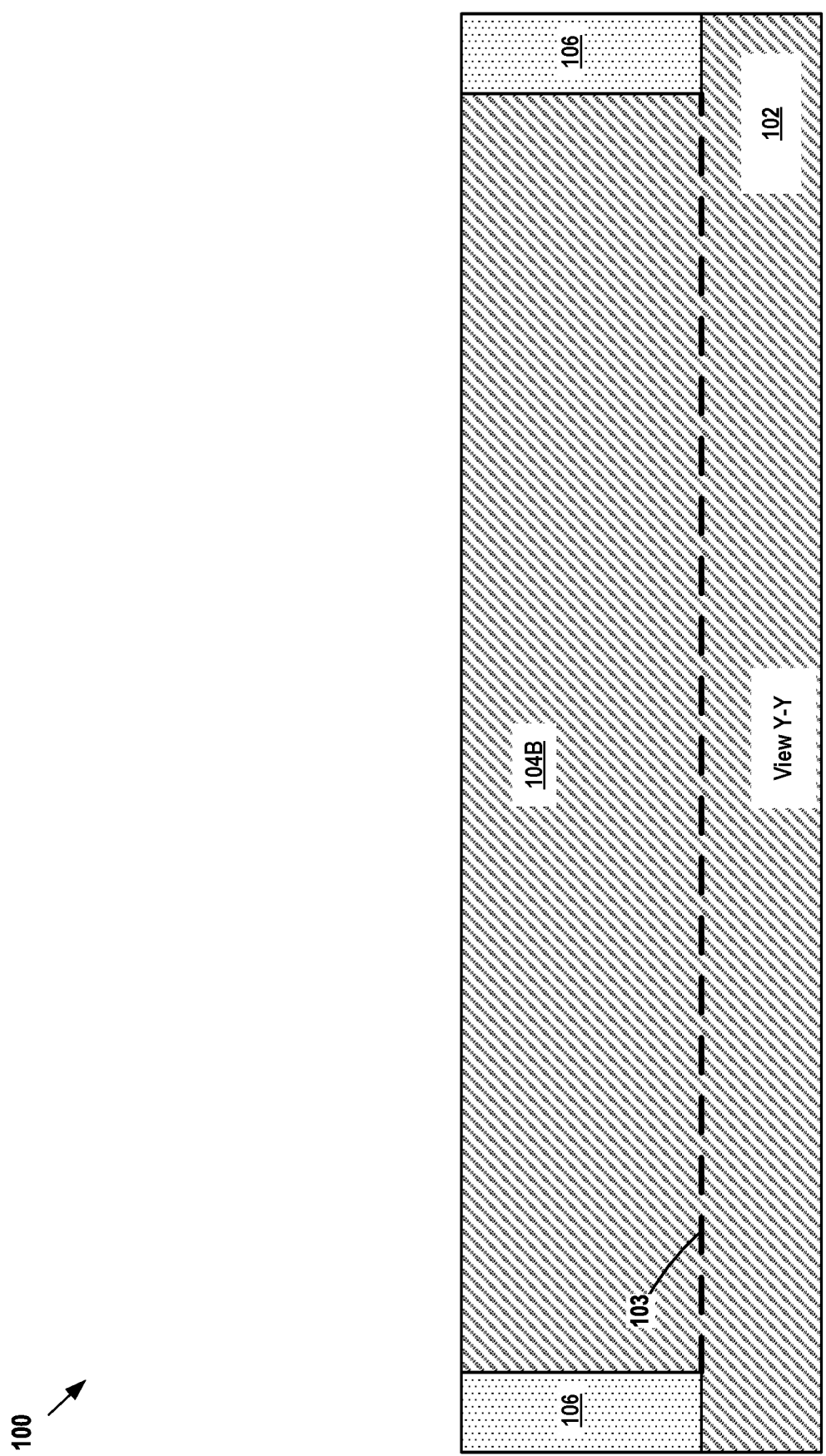

FIGS. 1-3 depict the IC product 100 after several process operations were performed. More specifically, the fins 104 were formed in the substrate 102 using traditional manufacturing techniques. For example, a patterned fin-formation etch mask (not shown—comprised of, for example, a layer of silicon dioxide and a layer of silicon nitride) was formed above the substrate 102. Thereafter, one or more etching processes, e.g., anisotropic etching processes, were performed through the patterned fin-formation etch mask to form a plurality of fin-formation trenches 103 in the substrate 102 and thereby define the plurality of fins 104 each having an upper surface 104X. The overall size, shape and configuration of the fin-formation trenches 103 and fins 104 may vary depending on the particular application. In the examples depicted herein, the fins 104 will be depicted as have a simplistic rectangular cross-sectional configuration having a substantially uniform thickness throughout the height of the fin 104. In a real-world device, the fins 104 may have a tapered cross-sectional configuration, wherein the width of the upper surface 104X of the fin 104 (i.e., the top critical dimension) is less than the width of the bottom of the fin 104.

Next, a layer of insulating material 106 was formed so as to over-fill the trenches 103 between the fins 104. That is, the layer of insulating material 106 was initially formed such that its upper surface was positioned above the upper surface of the patterned fin-formation etch mask. Thereafter, one or more planarization processes (e.g., a CMP and/or etch-back process) was performed to remove portions of the layer of insulating material 106 and the patterned fin-formation etch mask. These processes result in the layer of insulating material 106 having a planarized upper surface 106X and in the exposure of the upper surface 104X of the fins 104. The layer of insulating material 106 may be comprised of, for example, silicon dioxide.

Figure 4:
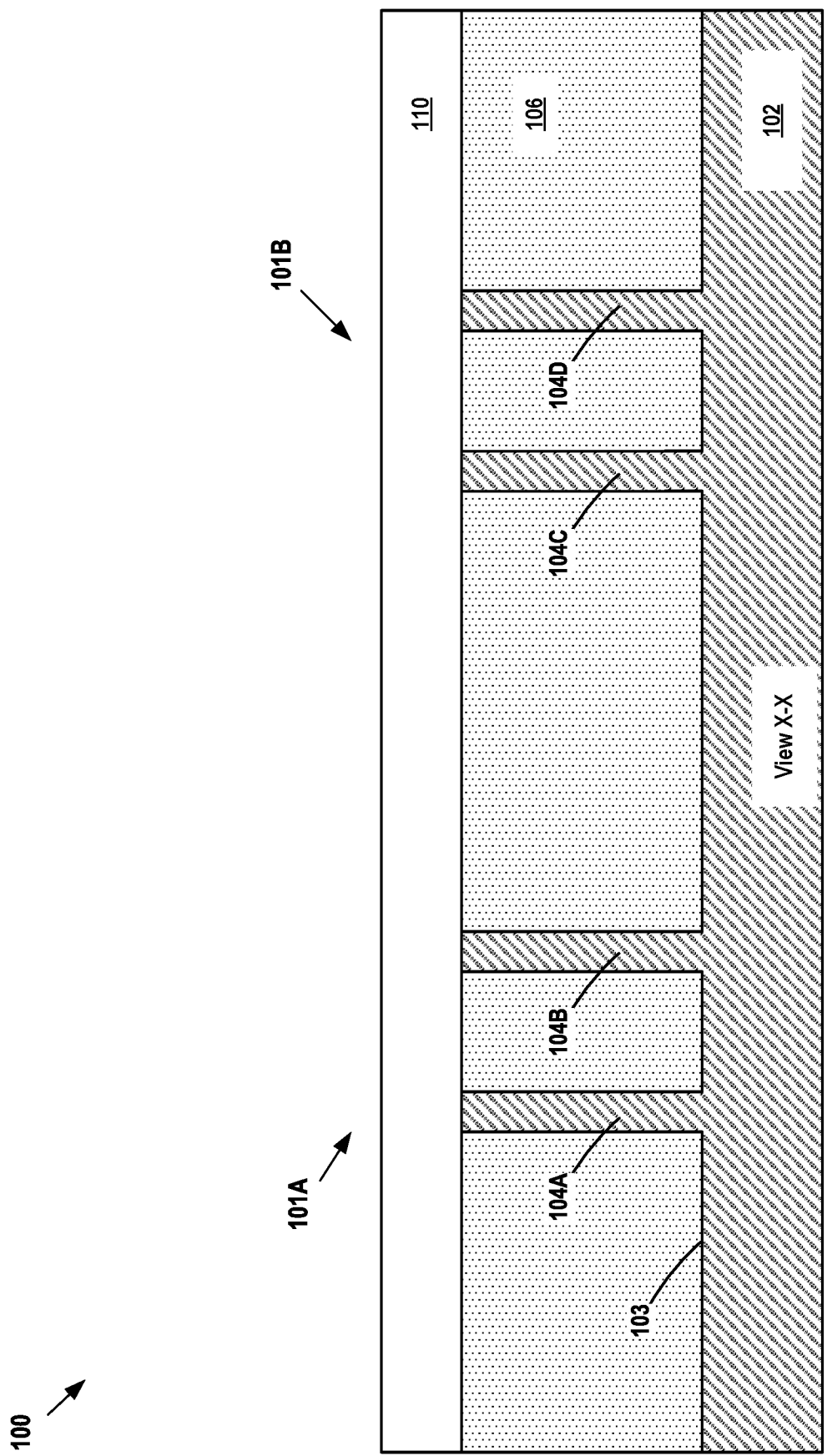
Figure 5:
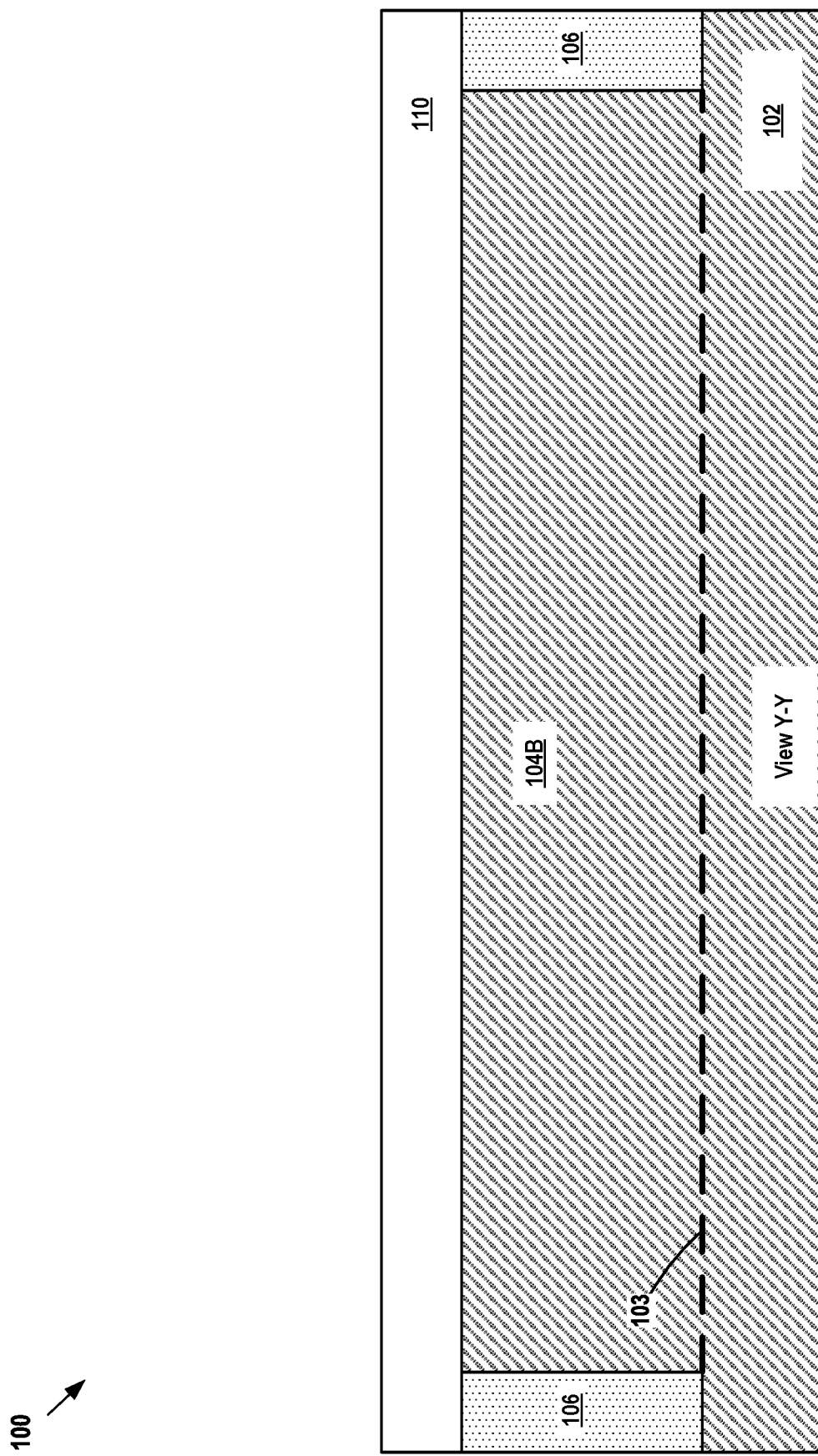

FIGS. 4 and 5 depict the IC product 100 after a layer of material 110 was formed above the substrate 102. The layer of material 110 may be comprised of, for example, silicon nitride, and it may be formed to any desired thickness.

Figure 6:
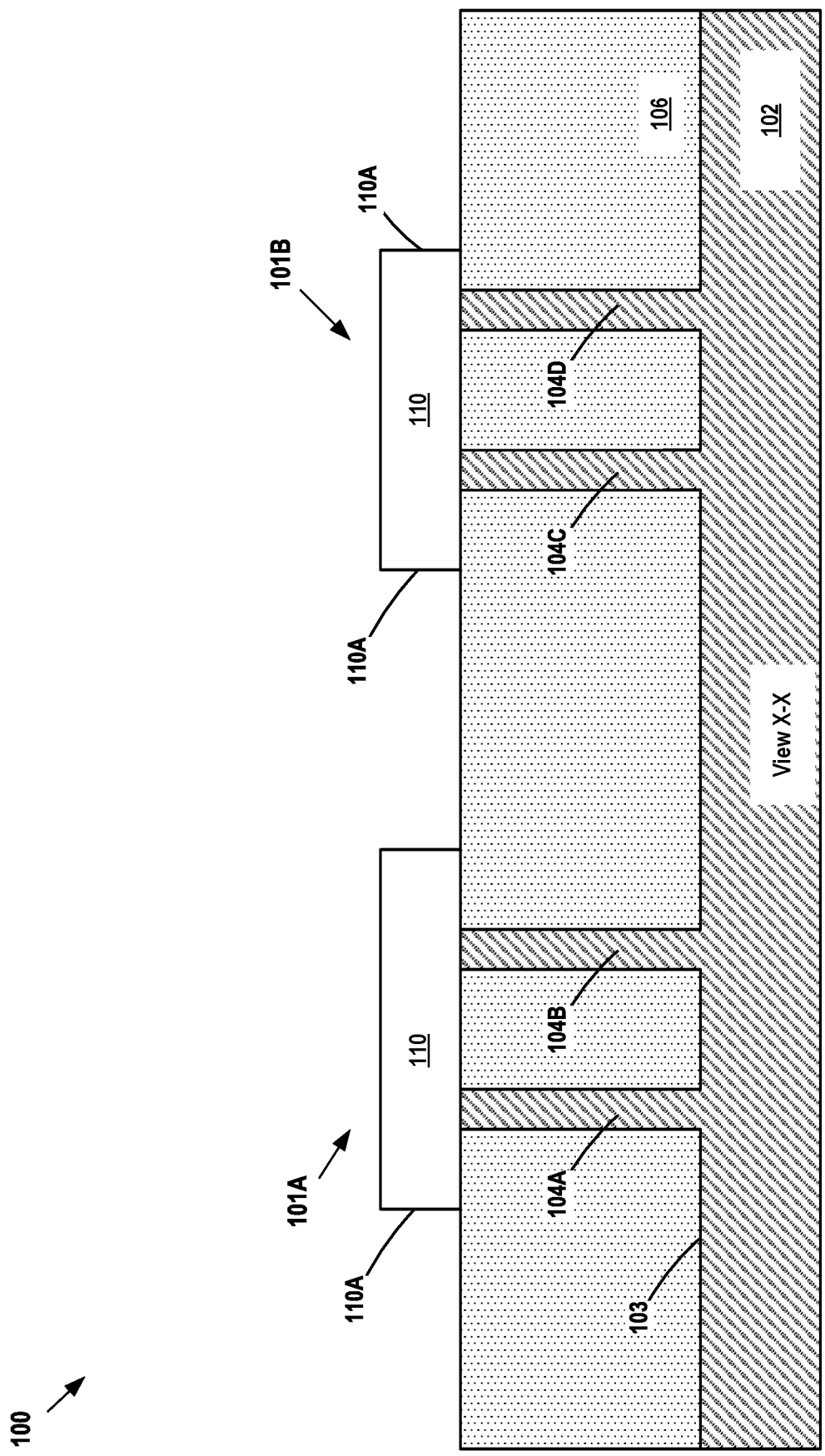
Figure 7:
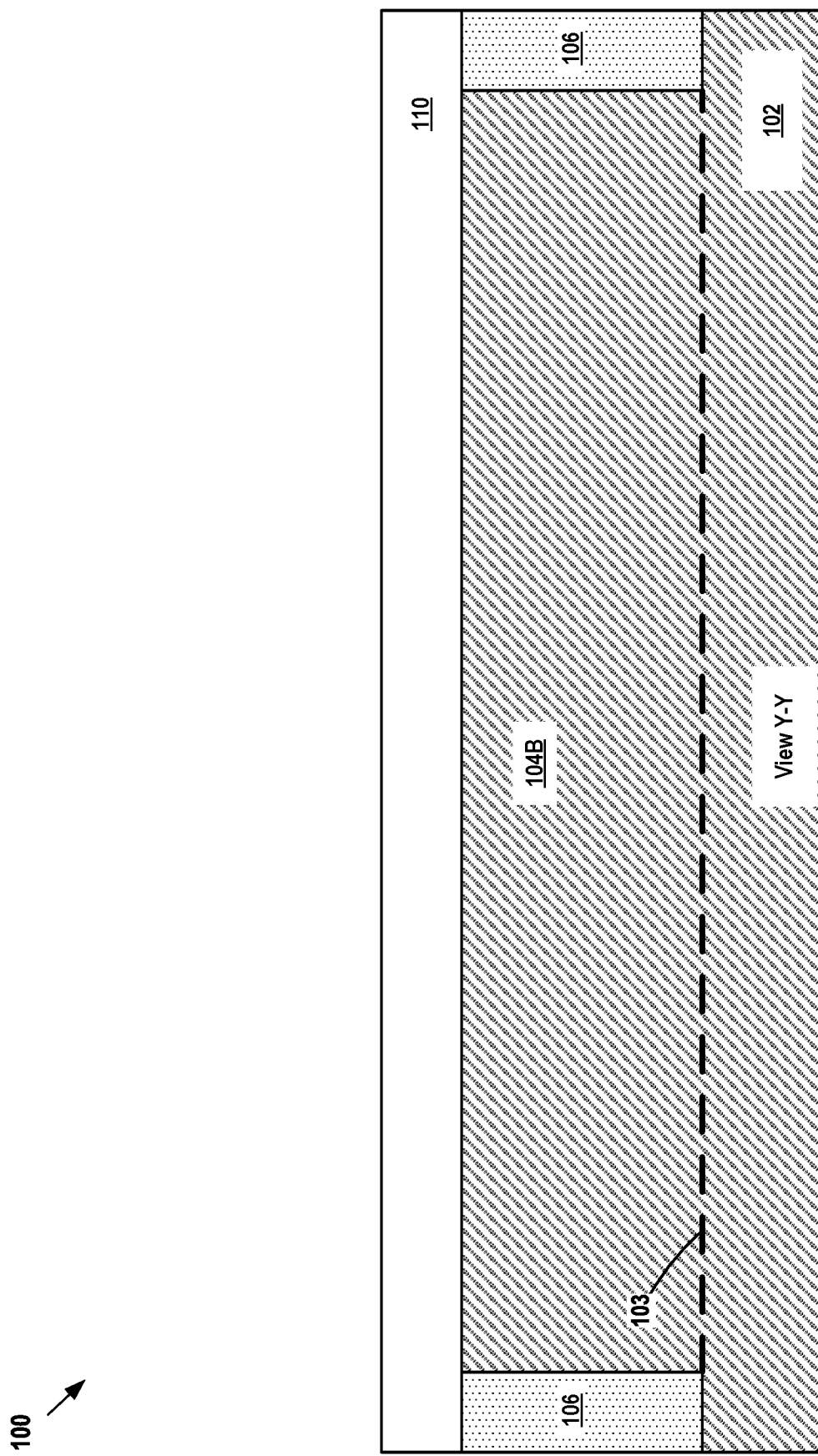

FIGS. 6 and 7 depict the IC product 100 after several process operations were performed. First, a patterned etch mask (not shown) was formed above the layer of material 110. In one illustrative example, the patterned etch mask may be a patterned layer of photoresist or OPL. Thereafter, an etching process was performed to remove exposed portions of the layer of material 110. These operations result in the formation of a plurality of substantially rectangular shaped openings 110A (when viewed from above) in the patterned layer of material 110.

Figure 8:
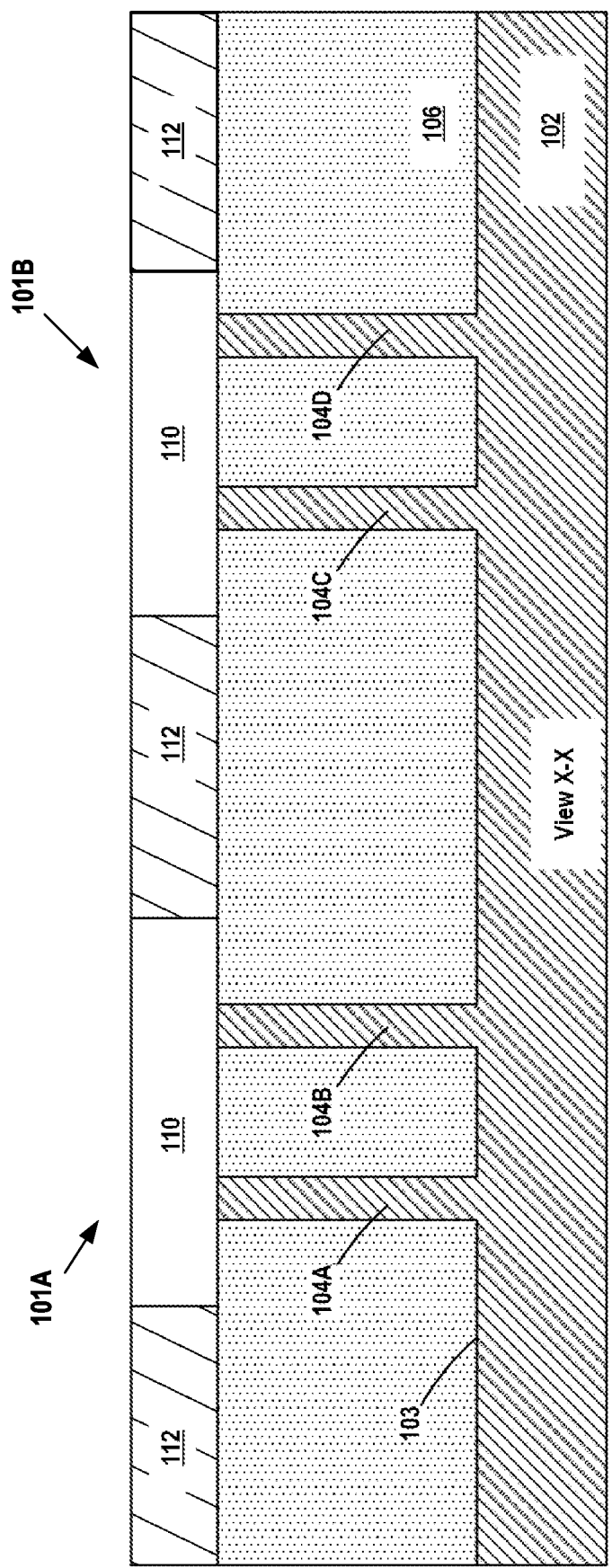
Figure 9:
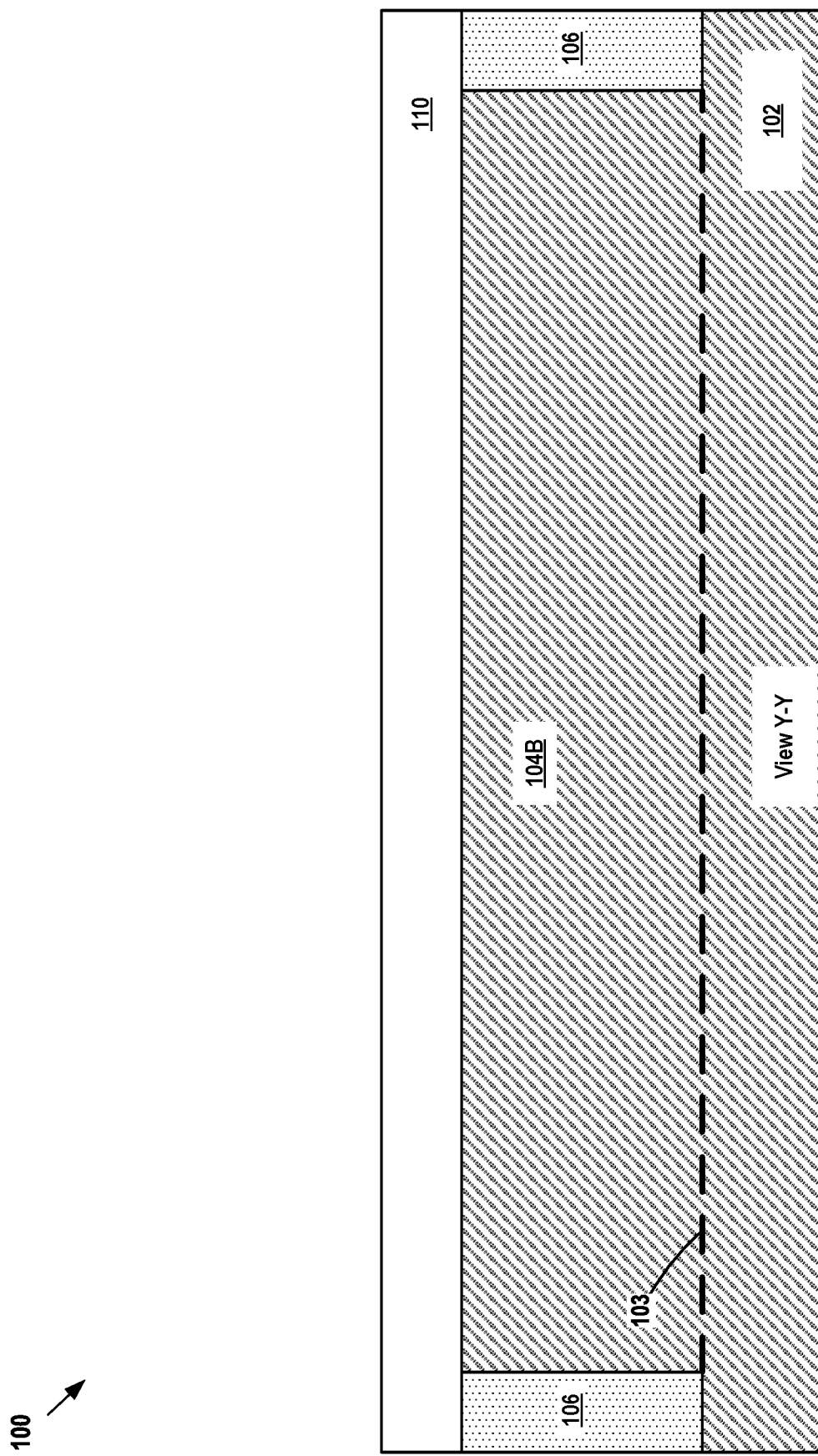

FIGS. 8 and 9 depict the IC product 100 after several process operations were performed. First, a layer of insulating material 112 was formed so as to over-fill the openings 110A in the patterned layer of material 110. Thereafter, one or more planarization processes (e.g., a CMP and/or etch-back process) was performed to remove portions of the layer of insulating material 112 positioned above the upper surface of the patterned layer of material 110. These processes result in portions of the layer of insulating material 112 being positioned in the openings 110A in the patterned layer of material 110. The layer of insulating material 112 may be comprised of any of a variety of different oxide materials, e.g., an HDP oxide, etc.

Figure 10:
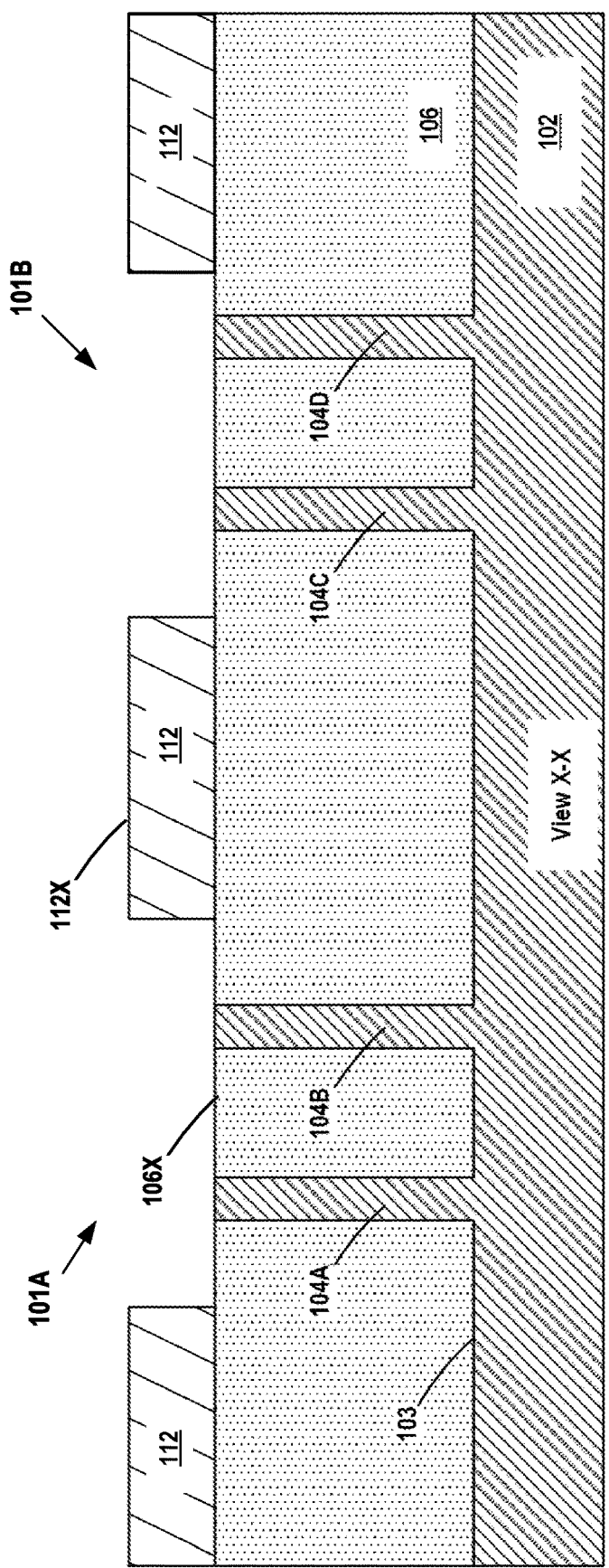
Figure 11:
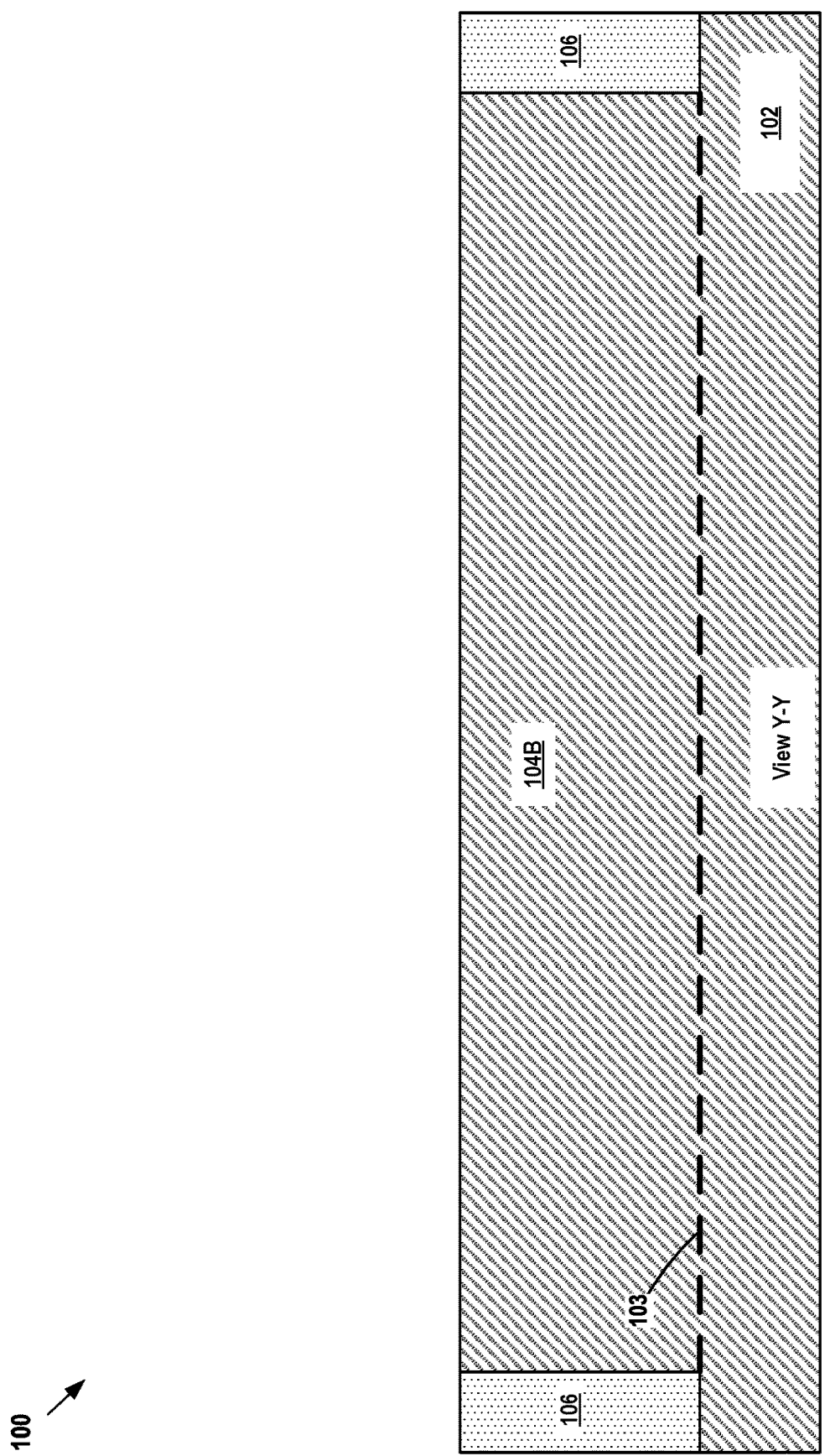
Figure 12:
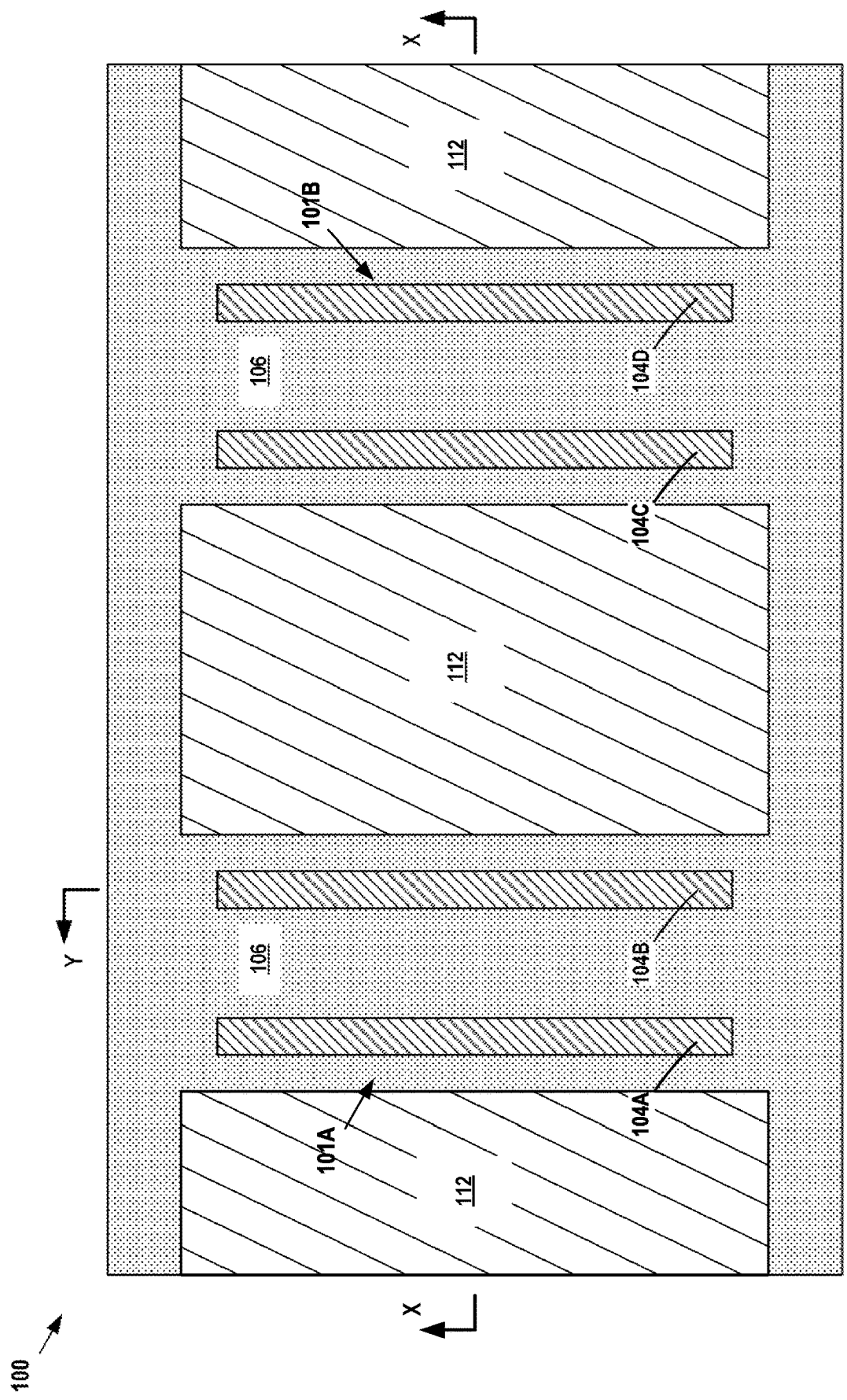

FIGS. 10 and 11 are cross-sectional views that depict the IC product 100 after an etching process was performed to remove the patterned layer of material 110 selectively relative to the surrounding materials. FIG. 12 is a plan view of the IC product 100 showing the remaining islands of the layer of insulating material 112 after the patterned layer of material 110 was removed. Note that the upper surface 112X of the islands of the layer of insulating material 112 is positioned at a level that is above the level of the upper surface 106X of the insulating material 106.

Figure 13:
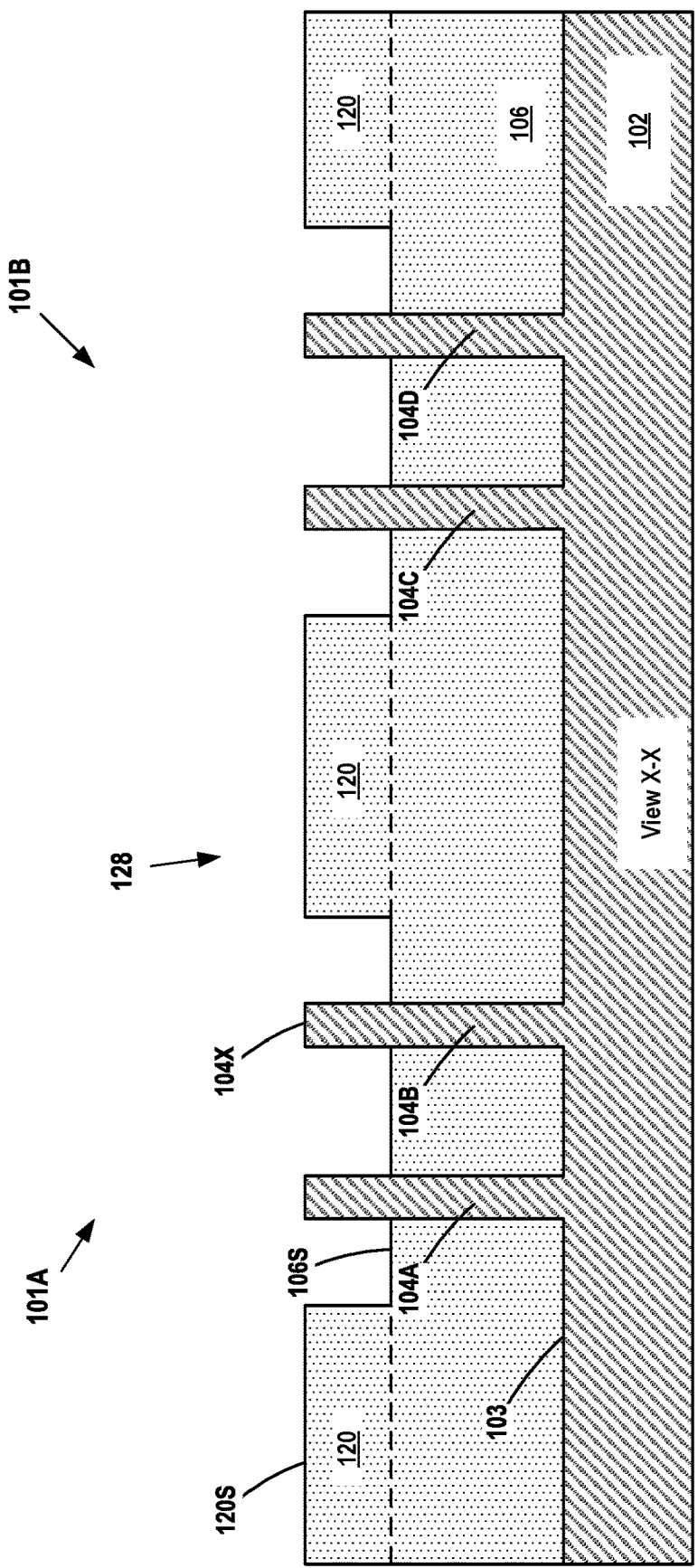
Figure 14:
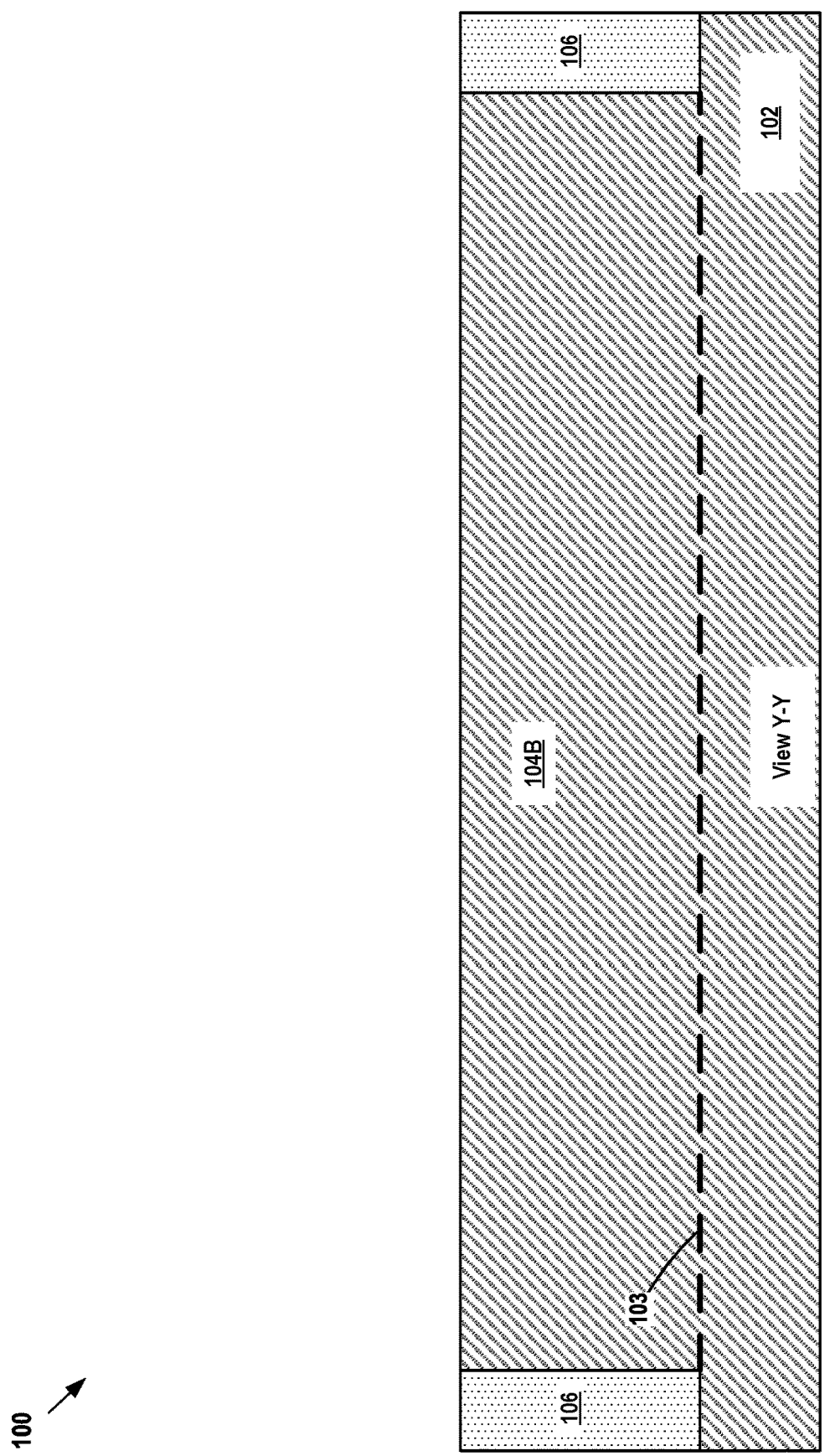
Figure 15:
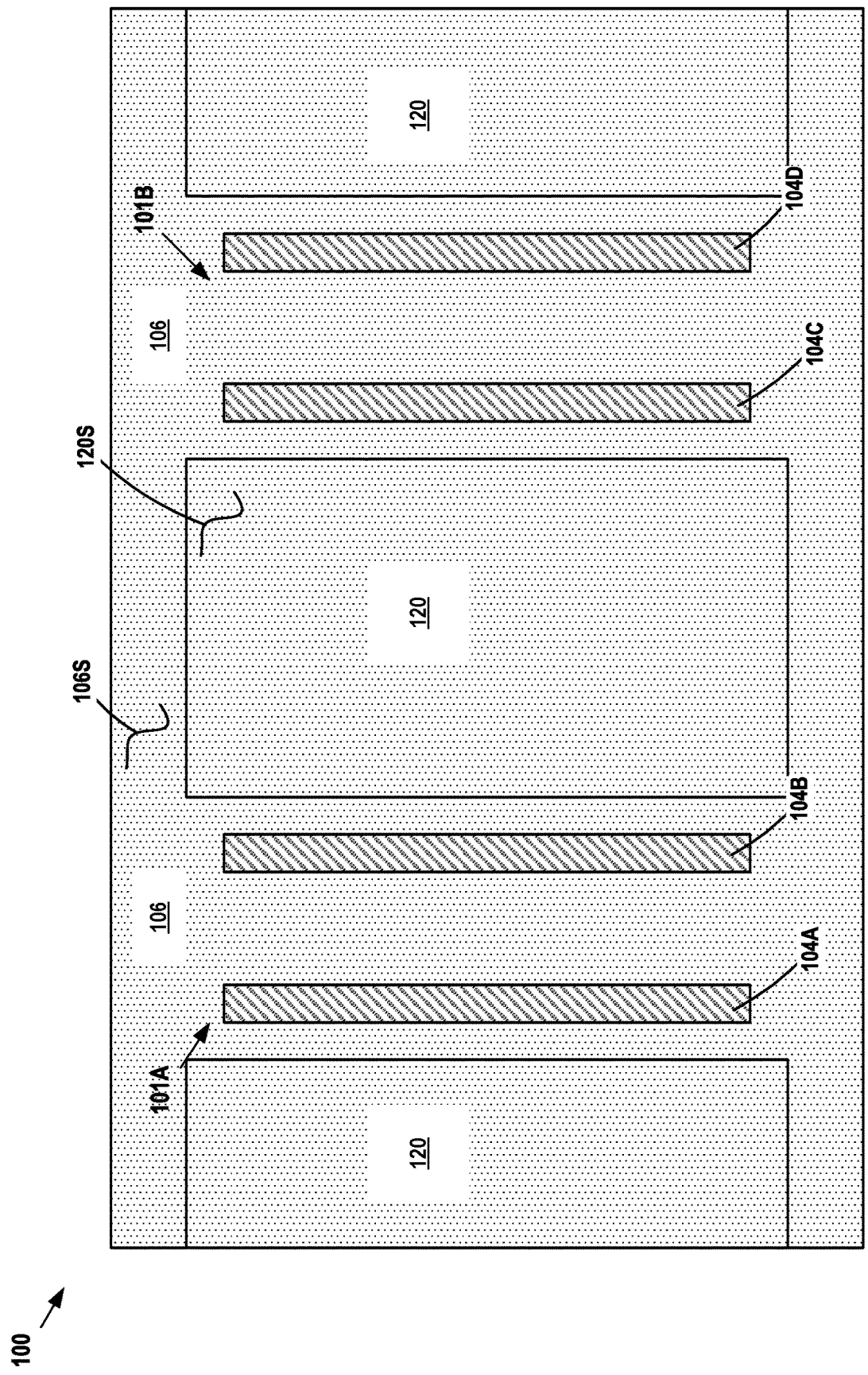

FIG. 13 (cross-sectional view), FIG. 14 (cross-sectional view) and FIG. 15 (plan view) depict the IC product 100 after a timed, anisotropic recess etching process was performed to remove some of the thickness of the exposed portions of the layer of insulating material 106 and to remove substantially all of the islands of the layer of insulating material 112. The recess etching process was performed for a sufficient duration such that the layer of insulating material 106 in the area adjacent and between the fins 104 has a recessed upper surface 106S that is positioned at a desired height level within the trenches 103. The amount of recessing of the layer of insulating material 106 may vary depending upon the particular application. This recess etching process exposes the desired final fin height of the fins 104 for the devices 101. Also note that, due to the presence of the islands of the layer of insulating material 112, the portions of the layer of insulating material 106 positioned under the islands of the layer of insulating material 112 may not be etched at all, or to a much less extent than the exposed portions of the layer of insulating material 106 positioned adjacent and between the fins 104.

This process operation results in the formation of a multi-level isolation structure 128 that has a non-planar upper surface, i.e., there is a step height in the upper surface of the overall isolation structure 128. In the depicted example, the elevated regions 120 of the insulating material 106 have an upper surface 120S that is positioned at a level that is above the level of the recessed surface 106S of the insulating material 106 positioned between and adjacent the fins 104. The differences in these height levels, i.e., the step height, may vary depending upon the particular application, e.g., 30-50 nm. In one illustrative embodiment, the upper surface 120S of the elevated regions 120 of insulating material may be positioned at a level that is substantially coplanar with the upper surface 104X of the fins 104. In other situations, the upper surface 120S of the elevated regions 120 of insulating material may be positioned at a level that is below or above the upper surface 104X of the fins 104 by an amount that may vary depending upon the particular application, e.g., about 10 nm above or about 10 nm below the upper surface 104X of the fins 104. In the illustrative example wherein the upper surface 120S of the elevated regions 120 of the insulating material are positioned above the upper surface 104X of the fins 104, a portion of the layer of material 112 will be part of the elevated regions 120 of the insulating material. In other applications, the isolation structure 128 is a single layer of material, e.g., silicon dioxide, wherein the stepped upper surface is formed in the single layer of silicon dioxide.

Figure 16:
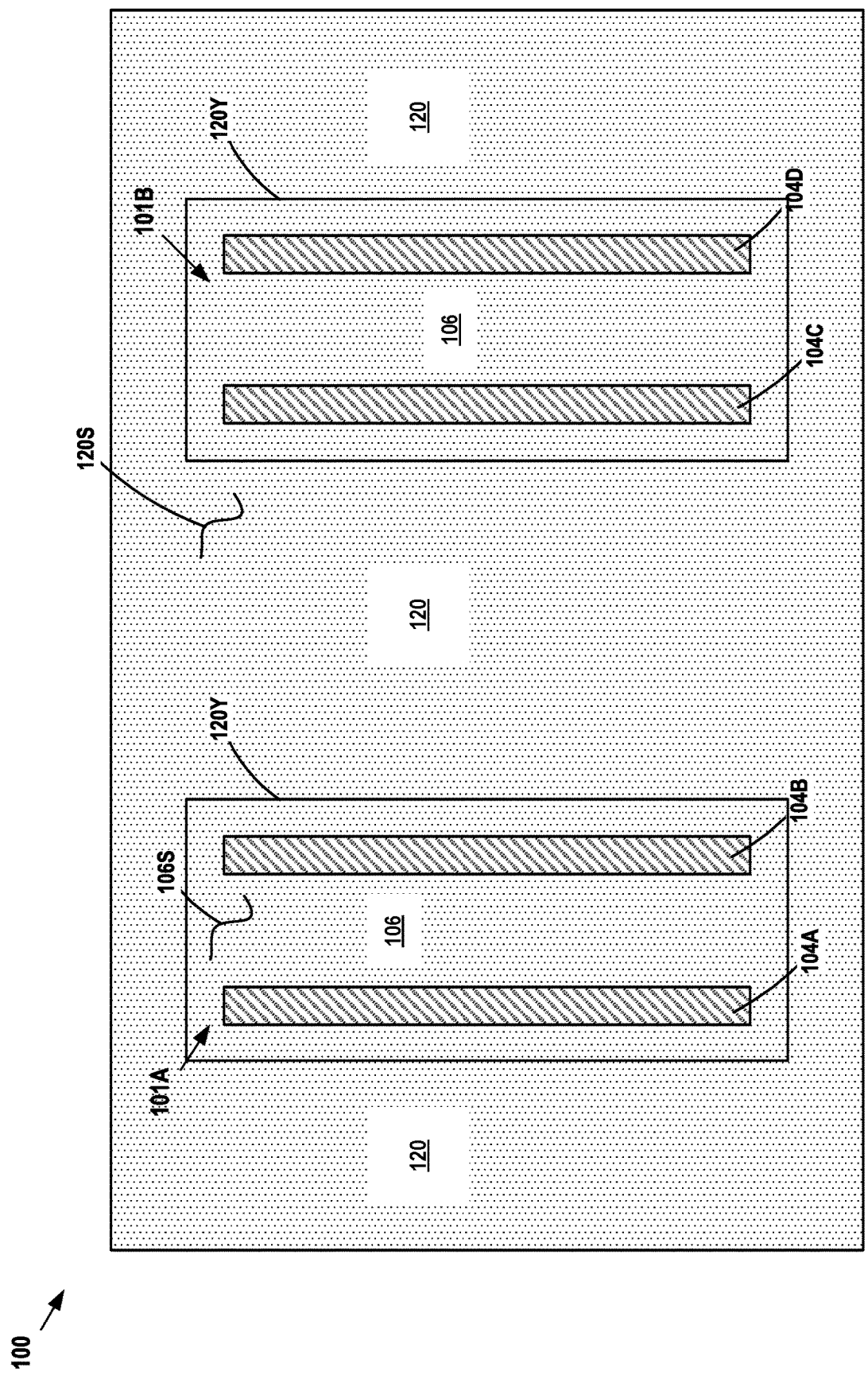

In some applications, the regions of insulating material 120 may be islands of such material. In one illustrative embodiment, the elevated island regions 120 of insulating material may be positioned between the fins 104 of the two adjacent transistor devices 101. With reference to FIG. 16, if desired, the process flow could be modified such that substantially rectangular shaped openings 120Y are formed in the regions 120 of elevated insulating material, with the fins 104 being positioned within the substantially rectangular shaped openings 120Y. Irrespective of the form or shape of the elevated regions 120 of the insulating material, the magnitude of the lateral spacing between the elevated regions 120 of insulating material and the sidewall of the nearest fin 104 may vary depending upon the particular application.

Figure 17:
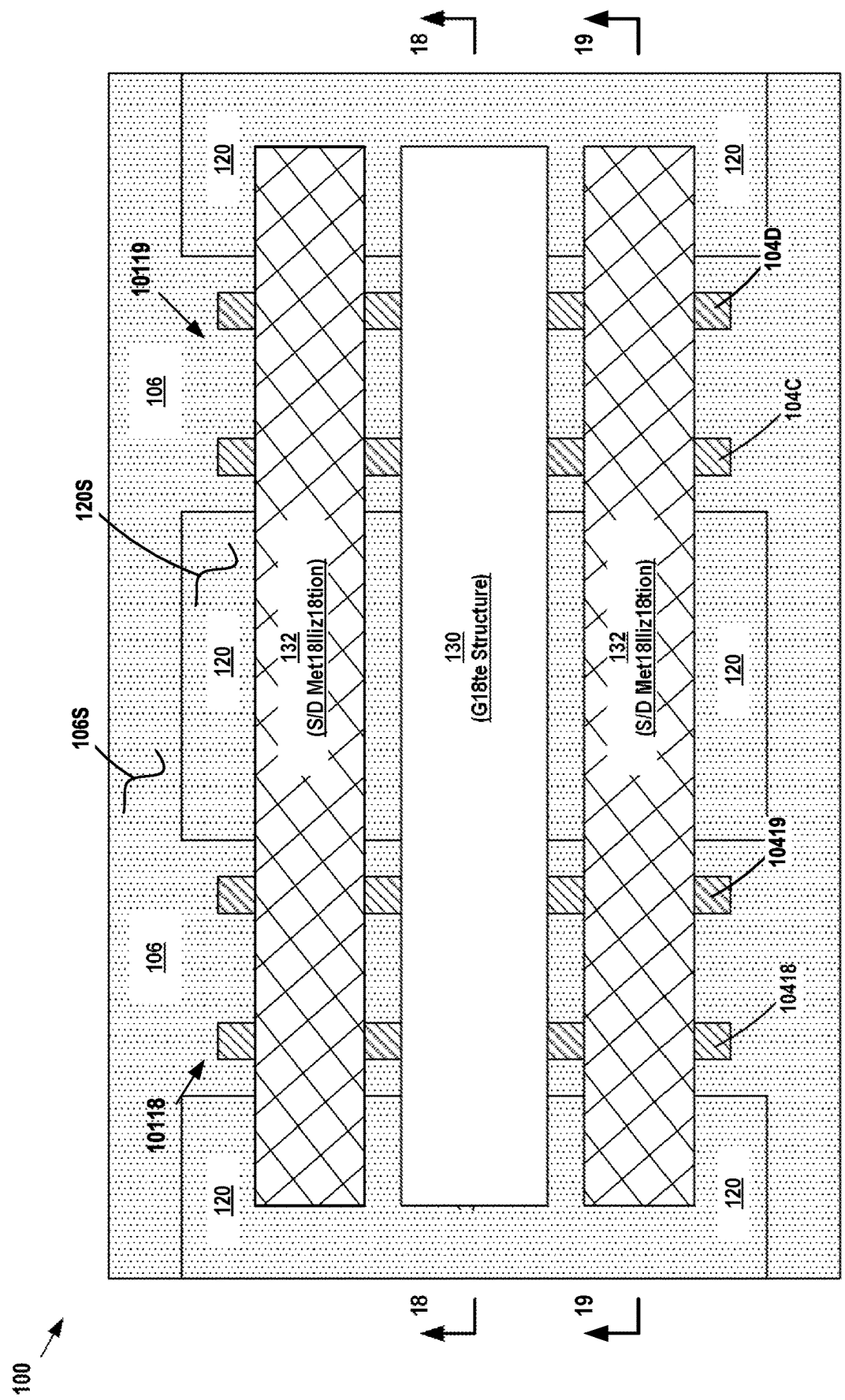
Figure 18:
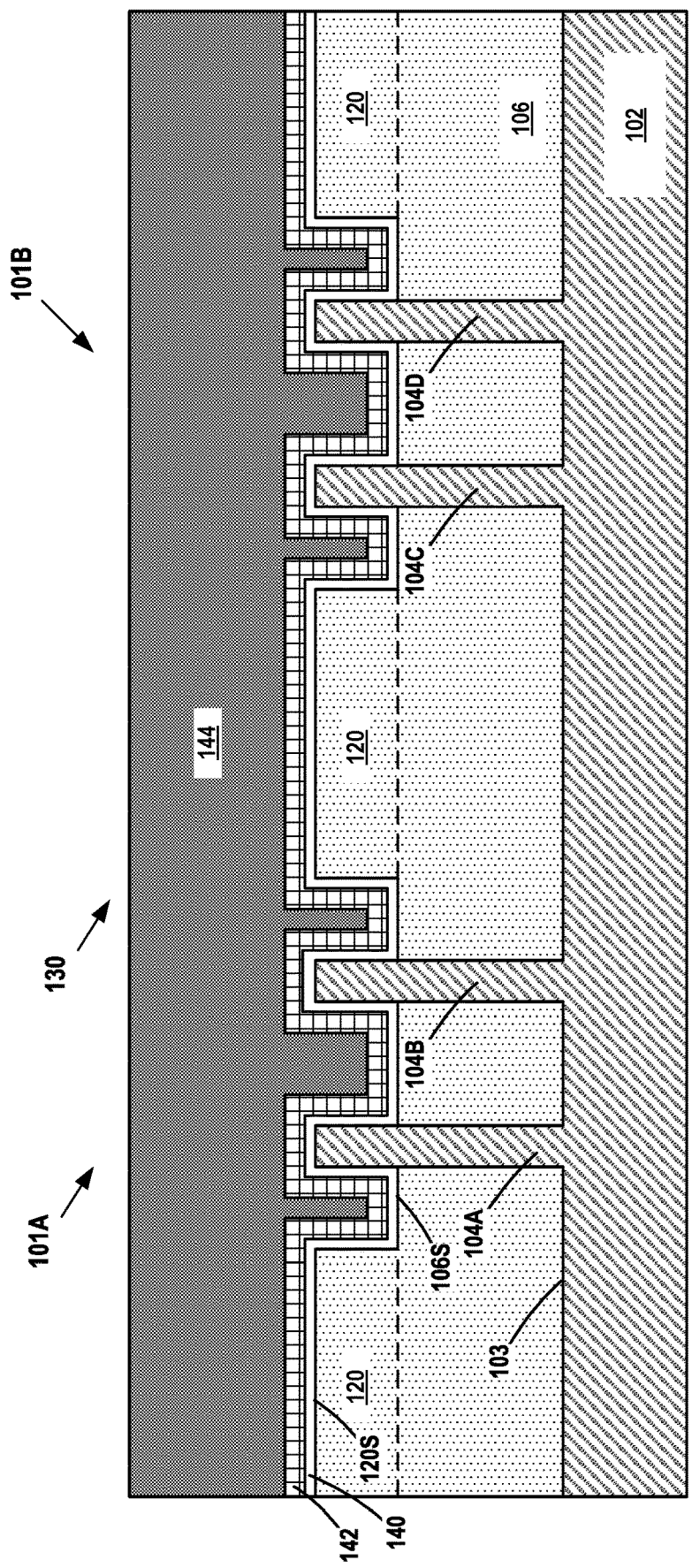
Figure 19:
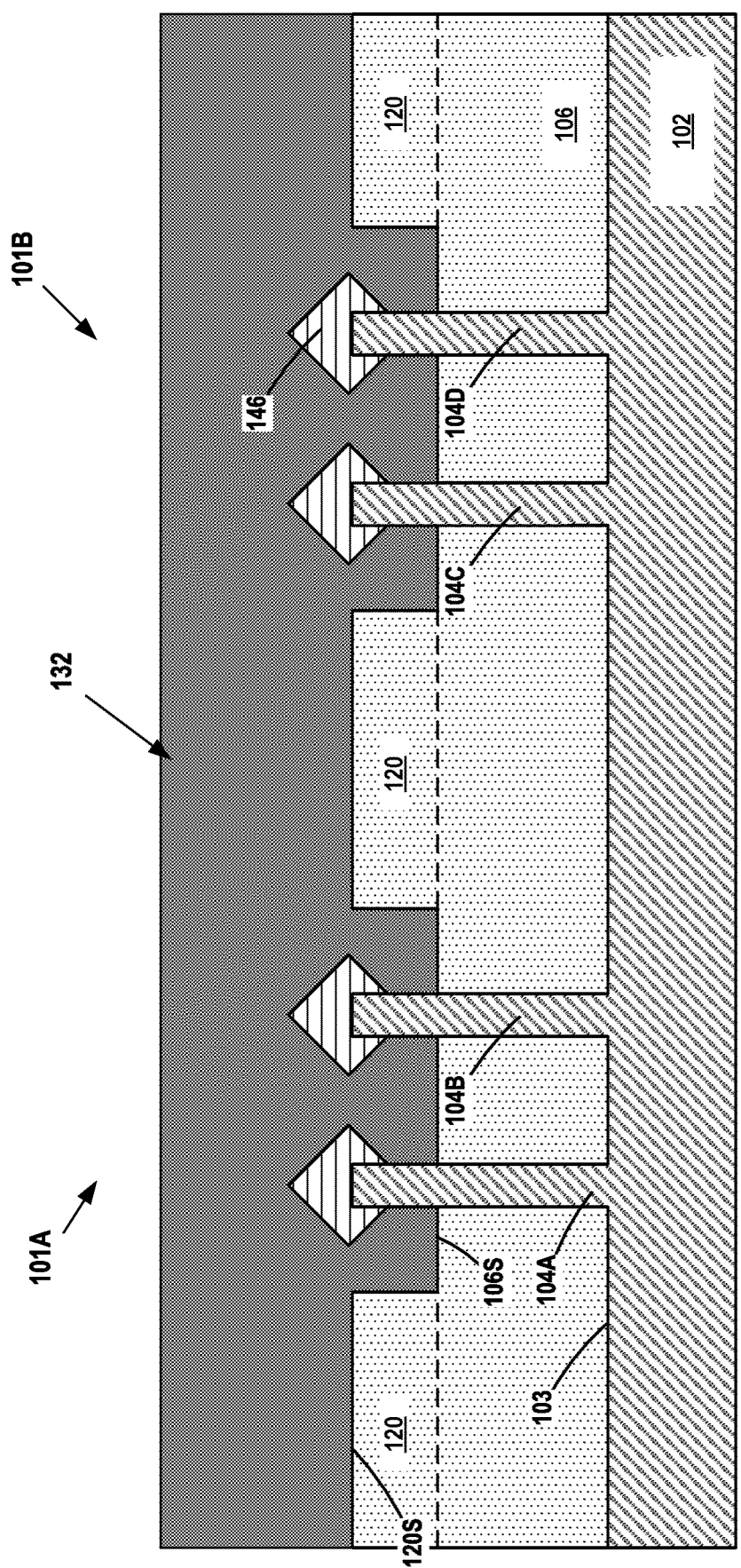

FIG. 17 depicts the IC product 100 after an illustrative gate structure 130 and source/drain metallization structures 132 have been formed for the devices by performing known manufacturing operations. As indicated in FIG. 17, FIG. 18 is a cross-sectional view taken through the gate structure 130 in a direction corresponding to the gate width direction of the devices 101, while FIG. 19 is a cross-sectional view taken through one of the source/drain metallization structures 132 in a direction corresponding to the gate width direction of the devices 101. As will be appreciated by those skilled in the art, other structures or components of the completed devices 100 are not depicted in one or more of FIGS. 17-19, e.g., gate cap structures, sidewall spacers, epitaxial material that may be formed in the source/drain regions of the devices 101, etc.

With reference to FIG. 18, and as will be appreciated by those skilled in the art after a complete reading of the present application, the gate structure 130 of the transistor devices 101 disclosed herein may be manufactured using known gate-first or replacement gate manufacturing techniques, and the materials of construction for the gate structure 130 may vary depending upon the particular application. In one illustrative example, the gate structure 130 may comprise a high-k gate insulation layer 140, such as hafnium oxide, a material having a dielectric constant greater than 10, etc., one or more conductive work-function adjusting metal layers 142, e.g., titanium, tantalum, titanium nitride, tantalum nitride, titanium carbide, etc., as well as one or more bulk conductive layers of material 144, e.g., titanium, tungsten, aluminum, etc. The thickness of the layers of material 140, 142 and 144 may vary depending upon the particular application. In other situations, the gate structure 130 may comprise a gate insulation layer 140 made of silicon dioxide and the bulk conductive layer of material 144 may comprise polysilicon.

FIG. 19 depicts the IC product 100 after several process operations were performed. First, epitaxial semiconductor material 146 was formed on the portions of the fins 104 in the source/drain regions of the devices. Thereafter, various known process operations were performed to form the illustrative conductive source/drain metallization structures 132 (e.g., trench silicide structures) that are conductively coupled to the epi semiconductor material 146 in the source/drain regions of the transistor devices. In the depicted example, the conductive source/drain metallization structures 132 extend across substantially the entire active region of the devices 101 in the gate width (GW) direction of the devices 101. In one illustrative embodiment, the conductive source/drain metallization structures 132 may comprise a variety of different conductive materials, e.g., tungsten, cobalt, aluminum, a metal, a metal compound, cobalt silicide, nickel silicide, titanium silicide, nickel platinum silicide, etc.

Simulations have shown that the multi-level isolation structure 128 disclosed herein can reduce capacitance (Csg (F)) of the devices 101 as reflected in Table I below, wherein the step-height of the isolation structure is the difference in height between the upper surface 106S of the insulating material 106 positioned between the fins 104 and the upper surface 120S of the elevated regions 120 of the insulating material.

TABLE I

| Structure | Step-Height (nm) | Csg (F) |
|---|---|---|
| Isolation Structure 1 | 0 (control) | 8.9167e−17 |
| Isolation Structure 2 | 36 | 8.9605e−17 |
| Isolation Structure 3 | 65 | 8.3956e−17 |

As reflected in the above Table 1, isolation structure 1—with zero step-height—was used to compare the impact of the formation of the multi-level isolation structure 128 disclosed herein (isolation structures 2 and 3) in terms of reducing the parasitic capacitance of the devices 101. As will be appreciated by those skilled in the art after a complete reading of the present application, the above-referenced decreases in the parasitic capacitance of the devices 101 using the multi-level isolation structure 128 disclosed herein can be useful in improving the performance characteristics of the devices 101.

Figure 20:
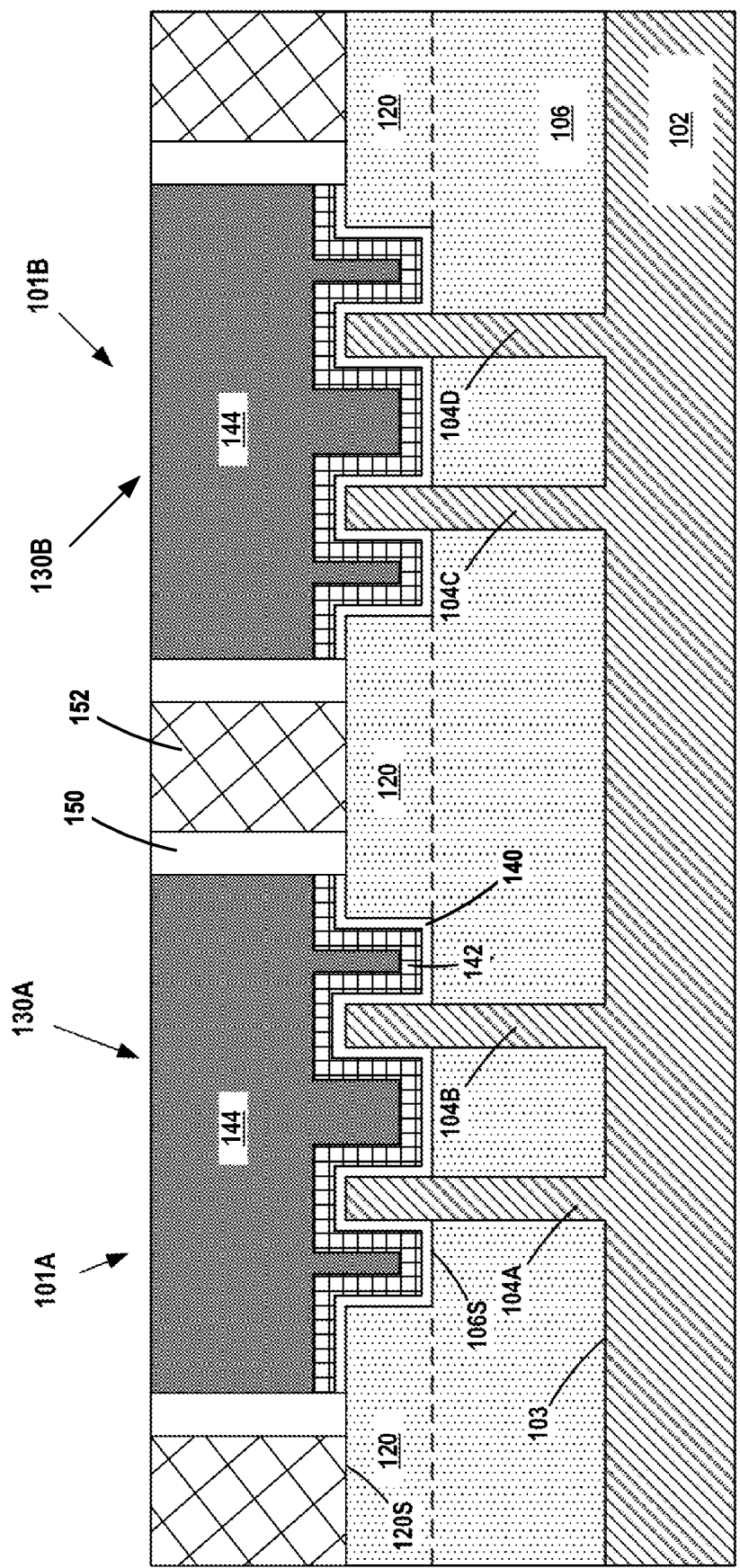
Figure 21:
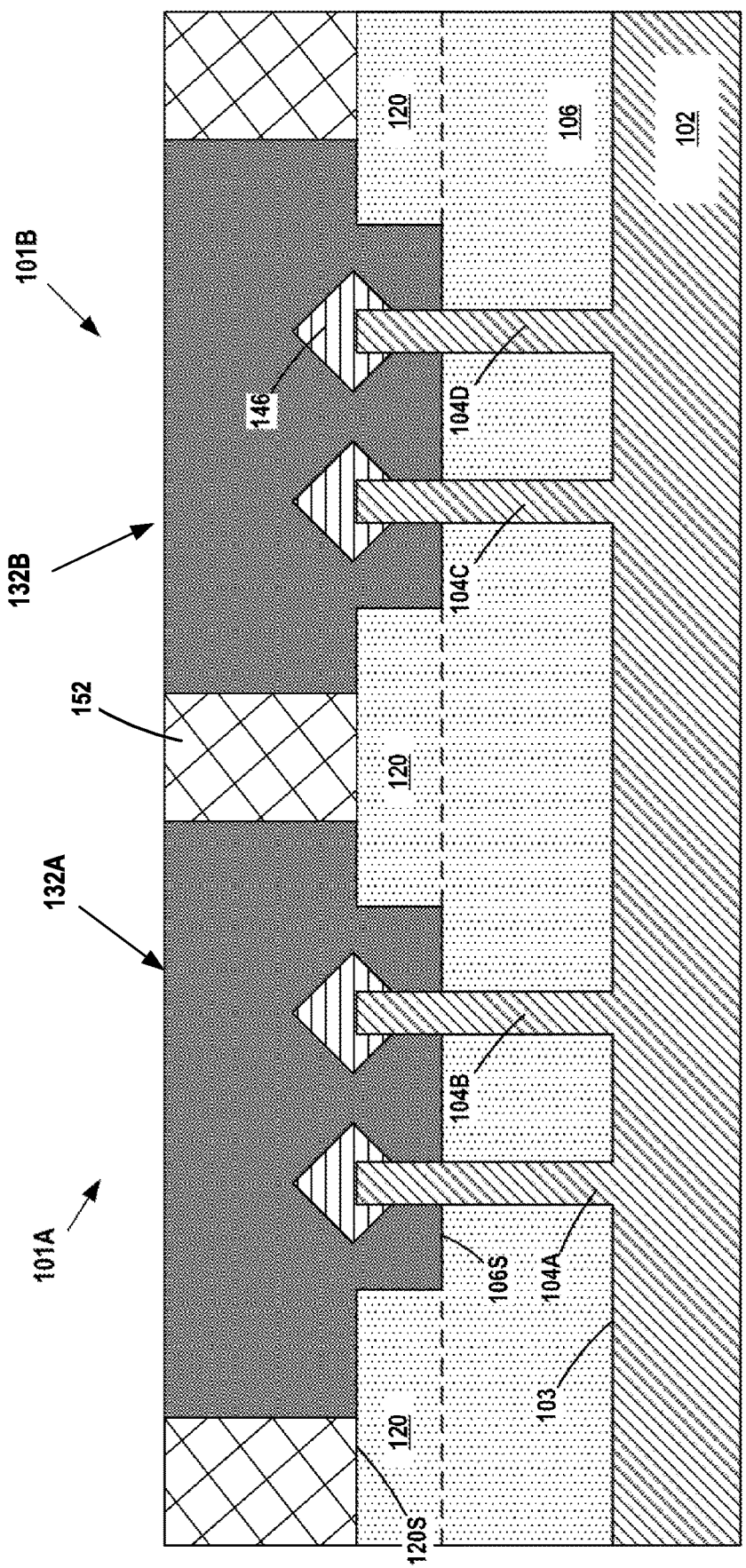

In the example depicted above, the gate structure 130 was shared by both of the transistor devices 101. However, as will be appreciated by those skilled in the art after a complete reading of the present application, the novel multi-level isolation structure 128 disclosed herein can be used on single transistor devices as well. FIGS. 20 and 21 show an embodiment where separate transistor devices 101A, 101B with separate gate structures 130A, 130B and separate conductive source/drain metallization structures 132A, 132B are formed above the novel multi-level isolation structure 128 disclosed herein. As shown in FIG. 20, a sidewall spacer 150, e.g., silicon nitride, was formed on each of the gate structures 130A, 130B and an insulating material 152, e.g., silicon dioxide, was formed between the spacers 150. As shown in FIG. 21, the conductive source/drain metallization structures 132A, 132B were formed in openings formed in the insulating material 152.

With reference to the single device 101A shown in FIG. 20, one illustrative IC product disclosed herein comprises at least one fin structure, e.g., one of the fin structures 104A, 104B, an isolation structure 128 comprising a single layer of insulating material, the layer of insulating material 106 having a stepped upper surface comprising a first upper surface 106S and a second upper surface 120S, wherein the first upper surface 106S is positioned at a first level and the second upper surface 120S is positioned at a second level, wherein the first level is below the second level. The product also includes a gate structure 130A comprising a first portion and a second portion, wherein the first portion of the gate structure 130A is positioned above the first upper surface 106S of the layer of insulating material 106 and above the at least one fin structure, e.g., one of the fin structures 104A, 104B, and the second portion of the gate structure is positioned above the second upper surface 120S of the layer of insulating material 106, i.e., one or both of the end portions of the gate structure 130A is positioned above regions 120 of elevated insulating material 106.

With reference to the single device 101A shown in FIG. 20, another illustrative IC product disclosed herein comprises at least one fin structure, e.g., one of the fin structures 104A, 104B, an isolation structure 128 comprising a first region of insulating material positioned adjacent the at least one fin structure, i.e., the portion of the insulation material 106 with a recessed upper surface 106S and a second region of insulating material, i.e., the elevated regions 120 of the insulating material that are positioned adjacent the first region of insulating material. In this example, the upper surface 106S of the first region of the isolation structure 128 is positioned at a first level and the upper surface 120S of the second region of the isolation structure 128 is positioned at a second level, wherein the first level is below the second level. Additionally, the gate structure 130A comprises a first portion and a second portion, wherein the first portion of the gate structure 130A is positioned above the first region of the isolation structure and above the at least one fin structure, e.g., one of the fin structures 104A, 104B, and wherein the second portion of the gate structure 130A is positioned above the second portion of the isolation structure 128, i.e., one or both of the end portions of the gate structure 130 is positioned above elevated regions 120 of insulating material.

With reference to the two devices 101 shown in FIG. 18, another illustrative IC product disclosed herein comprises a first transistor 101A comprising at least one first fin structure, e.g., one of the fin structures 104A, 104B, and a second transistor comprising at least one second fin structure, e.g., one of the fin structures 104C, 104D. The IC product also includes an isolation structure 128 comprising an upper surface having a first region, a second region and a third region that is positioned between the first region and the second region, wherein the first region of the isolation structure 128 is positioned adjacent the at least one first fin structure and the second region of the isolation structure 128 is positioned adjacent the at least one second fin structure. In this example, the upper surface 106S of the first and second regions of the isolation structure 128 are positioned at a first level and an upper surface 120S of the third region of the isolation structure 128 is positioned at a second level, wherein the first level is below the second level. This embodiment of the IC product 100 also includes a shared gate structure 130 comprising a first portion, a second portion and a third portion, wherein the second portion is positioned between the first portion and the third portion. The first portion of the shared gate structure 130 is positioned above the first region of the isolation structure 128 and above the at least one first fin structure, e.g., one of the fin structures 104A, 104B, the third portion of the shared gate structure 130 is positioned above the second region of the isolation structure 128 and above the at least one second fin structure, e.g., one of the fin structures 104C, 104D, and the third portion of the shared gate structure 130 is positioned above the second portion of the isolation structure 128.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:
1. A device, comprising:
at least one fin structure;
an isolation structure having a stepped upper surface comprising a first region comprising a first upper surface and a second region comprising a second upper surface, wherein the first upper surface of the isolation structure is positioned at a first level and the second upper surface of the isolation structure is positioned at a second level, wherein the first level is below the second level;

a gate structure comprising a first portion and a second portion, wherein the first portion of the gate structure is positioned above the first upper surface of the isolation structure and above the at least one fin structure and wherein the second portion of the gate structure is positioned above the second upper surface of the isolation structure; and first and second source/drain metallization structures positioned on opposite sides of the gate structure, wherein each of the first and second source/drain metallization structures comprises a first portion and a second portion, wherein the first portion of the source/drain metallization structure is positioned above the first upper surface of the isolation structure and a second portion of the source/drain metallization structure is positioned above the second upper surface of the isolation structure.

2. The device of claim 1, wherein the at least one fin structure comprises a plurality of fin structures and wherein the first upper surface of the isolation structure is positioned adjacent the plurality of fin structures and between adjacent fins in the plurality of fin structures.

3. The device of claim 1, wherein the at least one fin structure comprises an upper surface that is substantially coplanar with the second upper surface of the isolation structure.

4. The device of claim 1, wherein the at least one fin structure comprises an upper surface and wherein the second upper surface of the layer of insulating material is positioned at a level that is below a level of the upper surface of the at least one fin structure.

5. The device of claim 1, wherein a height difference between the first level and the second level falls within a range of about 30-50 nm.

6. The device of claim 1, wherein the isolation structure is a single layer of silicon dioxide and wherein the stepped upper surface is formed in the single layer of silicon dioxide.

7. A device, comprising:
at least one fin structure;
an isolation structure comprising an upper surface having a first region and a second region, wherein an upper surface of the first region of the isolation structure is positioned at a first level and an upper surface of the second region of the isolation structure is positioned at a second level, wherein the first level is below the second level;
a gate structure comprising a first portion and a second portion, wherein the first portion of the gate structure is positioned above the first region of the isolation structure and above the at least one fin structure and wherein the second portion of the gate structure is positioned above the second portion of the isolation structure; and
first and second source/drain metallization structures positioned on opposite sides of the gate structure, wherein each of the first and second source/drain metallization structures comprises a first portion and a second portion, wherein the first portion of the source/drain metallization structure is positioned above the first region of the isolation structure and a second portion of the source/drain metallization structure is positioned above the second portion of the isolation structure.

8. The device of claim 7, wherein each of the at least one fin structure comprises an upper surface that is substantially coplanar with the upper surface of the second region of the isolation structure.

9. The device of claim 7, wherein each of the at least one fin structure comprises an upper surface and wherein the upper surface of the second region of the isolation structure is positioned at a level that is below a level of the upper surface of at least one of the at least one fin structure.

10. The device of claim 7, wherein a height difference between the first level and the second level falls within a range of about 30-50 nm.

11. The device of claim 7, wherein the upper surface of the isolation structure is an upper surface of a single layer of insulating material.

12. An IC product, comprising:
a first transistor comprising at least one first fin structure;
a second transistor comprising at least one second fin structure;
an isolation structure comprising an upper surface having a first region, a second region and a third region that is positioned between the first region and the second region, wherein the first region of the isolation structure is positioned adjacent the at least one first fin structure and the second region of the isolation structure is positioned adjacent the at least one second fin structure and, wherein an upper surface of the first and second regions of the isolation structure are positioned at a first level and an upper surface of the third region of the isolation structure is positioned at a second level, wherein the first level is below the second level;
a shared gate structure comprising a first portion, a second portion and a third portion, wherein the second portion is positioned between the first portion and the third portion, and wherein the first portion of the shared gate structure is positioned above the first region of the isolation structure and above the at least one first fin structure, the third portion of the shared gate structure is positioned above the second region of the isolation structure and above the at least one second fin structure and the third portion of the shared gate structure is positioned above the second portion of the isolation structure; and
first and second source/drain metallization structures positioned on opposite sides of the shared gate structure, wherein each of the first and second source/drain metallization structures comprises a first portion, a second portion and a third portion, wherein the second portion is positioned between the first portion and the third portion, and wherein the first portion of the source/drain metallization structure is positioned above the first region of the isolation structure, the third portion of the source/drain metallization structure is positioned above the second region of the isolation structure and the third portion of the source/drain metallization structure is positioned above the second portion of the isolation structure.

13. The product of claim 12, wherein:
the at least one first fin structure comprises a plurality of first fin structures and wherein the first region of the isolation structure is further positioned between adjacent fins in the plurality of first fin structures; and
the at least one second fin structure comprises a plurality of second fin structures and wherein the second region of the isolation structure is further positioned between adjacent fins in the plurality of second fin structures.

14. The product of claim 12, wherein the at least one first fin structure comprises a first upper surface and the at least one second fin structure comprises a second upper surface, wherein the first upper surface and the second upper surface are substantially coplanar with the upper surface of the second region of the isolation structure.

15. The product of claim 12, wherein the at least one first fin structure comprises a first upper surface and the at least one second fin structure comprises a second upper surface, wherein the upper surface of the second region of the isolation structure is positioned at a level that is below a level of the first upper surface and the second upper surface.

16. The product of claim 12, wherein a height difference between the first level and the second level falls within a range of about 30-50 nm.

17. The product of claim 12, wherein the isolation structure comprises silicon dioxide, the gate structure comprises a high-k gate insulation layer, a metal work-function adjusting layer and a bulk conductive material layer.

18. The product of claim 12, wherein the upper surface of the isolation structure is an upper surface of a single layer of insulating material.

\* \* \* \* \*